(12) United States Patent
Rogojevic et al.

(10) Patent No.: US 8,022,623 B2
(45) Date of Patent: Sep. 20, 2011

(54) ULTRA-THIN MULTI-SUBSTRATE COLOR TUNABLE OLED DEVICE

(75) Inventors: Svetlana Rogojevic, Niskayuna, NY (US); Gautam Parthasarathy, Saratoga Springs, NY (US)

(73) Assignee: General Electric Company, Niskayuna, NY (US)

( * ) Notice: Subject to any disclaimer, the term of this patent is extended or adjusted under 35 U.S.C. 154(b) by 132 days.

(21) Appl. No.: 12/192,262

(22) Filed: Aug. 15, 2008

(65) Prior Publication Data
US 2010/0039023 A1    Feb. 18, 2010

(51) Int. Cl.
*H01L 51/50*    (2006.01)

(52) U.S. Cl. .......................... 313/510; 445/24

(58) Field of Classification Search .............. 313/506, 313/510; 445/24, 25
See application file for complete search history.

(56) References Cited

U.S. PATENT DOCUMENTS

| | | | |
|---|---|---|---|
| 4,777,402 A | 10/1988 | Mitsumori | |
| 6,211,538 B1 * | 4/2001 | Park | 257/88 |
| 6,252,356 B1 | 6/2001 | Tanabe et al. | |
| 6,486,601 B1 * | 11/2002 | Sakai et al. | 313/504 |
| 6,566,806 B1 * | 5/2003 | Kawai | 313/504 |
| 7,011,983 B2 | 3/2006 | Foust | |
| 7,049,757 B2 | 5/2006 | Foust et al. | |
| 7,259,391 B2 | 8/2007 | Liu | |
| 7,307,278 B2 | 12/2007 | Liu | |
| 2001/0036074 A1 | 11/2001 | Wang | |
| 2002/0043927 A1 * | 4/2002 | Kimura | 313/504 |
| 2003/0144996 A1 | 7/2003 | Moore | |
| 2003/0193289 A1 * | 10/2003 | Shirakawa et al. | 313/512 |
| 2005/0136285 A1 | 6/2005 | Litz et al. | |
| 2005/0212417 A1 | 9/2005 | Fournier | |
| 2005/0224935 A1 | 10/2005 | Schaepkens | |
| 2006/0047031 A1 | 3/2006 | Cella | |
| 2006/0086020 A1 | 4/2006 | Strip et al. | |
| 2006/0130894 A1 | 6/2006 | Gui | |
| 2006/0131565 A1 | 6/2006 | Lewis et al. | |
| 2006/0131567 A1 | 6/2006 | Liu | |
| 2006/0226522 A1 | 10/2006 | Liu | |
| 2006/0226523 A1 | 10/2006 | Foust | |
| 2006/0234059 A1 | 10/2006 | Cella | |

(Continued)

FOREIGN PATENT DOCUMENTS

EP    1865484 A    12/2007

(Continued)

OTHER PUBLICATIONS

Tada K et al, Patterned Emission from Polymeric Light-Emitting Device Realized by Photo-Irradiation in Air, Thin Solid Films, Elsevier-Sequoia S. A. Lausanne, CH, vol. 363, No. 1-2, Mar. 1, 2000, pp. 195-197, XP004189303, ISSN: 0040-6090.

(Continued)

*Primary Examiner* — Toan Ton
*Assistant Examiner* — Andrew Coughlin
(74) *Attorney, Agent, or Firm* — Mary Louise Gioeni (57) ABSTRACT

The present techniques provide methods and systems for forming devices that may be formed from light emitting regions of electroluminescent organic materials. The small size of the light emitting regions allows the formation of blended colors, which may be formed into illuminated designs. Multiple devices may be joined together to form multilayer panels, where nearer layers may have different designs than farther layers, or farther layers may have solid illuminated colors useful as backgrounds for nearer layers. Further, the multilayer devices may be used as color tunable light sources.

23 Claims, 5 Drawing Sheets

U.S. PATENT DOCUMENTS

| | | |
|---|---|---|
| 2006/0278965 A1 | 12/2006 | Foust |
| 2007/0001333 A1 | 1/2007 | Dias |
| 2007/0001589 A1* | 1/2007 | Taguchi et al. ............... 313/504 |
| 2007/0077452 A1 | 4/2007 | Liu |
| 2007/0120465 A1* | 5/2007 | Ito et al. ........................ 313/504 |
| 2007/0131278 A1 | 6/2007 | Liu |
| 2007/0159065 A1 | 7/2007 | Yan |
| 2007/0188086 A1 | 8/2007 | Choong |
| 2007/0200489 A1 | 8/2007 | Poon |
| 2008/0116815 A1 | 5/2008 | Foust et al. |
| 2008/0136317 A1 | 6/2008 | Rogojevic et al. |
| 2008/0136337 A1 | 6/2008 | Rogojevic et al. |
| 2008/0137008 A1 | 6/2008 | Rogojevic et al. |
| 2009/0184628 A1* | 7/2009 | Kang et al. .................... 313/504 |

FOREIGN PATENT DOCUMENTS

| | | |
|---|---|---|
| JP | 11040361 A | 2/1999 |
| JP | 2000058260 A | 2/2000 |
| WO | 9807136 | 2/1998 |
| WO | 2007102704 A | 9/2007 |

OTHER PUBLICATIONS

U.S. Appl. No. 11/733,901, filed Apr. 11, 2007, Liu et al.

Liu, Jie, et al., Photoactivated and Patternable Charge Transport Materials and Their Use in Organic Light-emitting Devices, Applied Physics Letters 90, 233503 (2007), 3 pages.

* cited by examiner

ULTRA-THIN MULTI-SUBSTRATE COLOR TUNABLE OLED DEVICE

BACKGROUND

The present techniques relate generally to large area signage, lighting and similar displays formed from organic light emitting materials. Specifically, the present techniques provide methods for making color-tunable signs from such materials.

This section is intended to introduce the reader to aspects of art that may be related to aspects of the present techniques, which are described and/or claimed below. This discussion is believed to be helpful in providing the reader with background information to facilitate a better understanding of the various aspects of the present techniques. Accordingly, it should be understood that these statements are to be read in this light, and not as admissions of prior art.

A developing trend in circuit and display technology involves the implementation of electronic and opto-electronic devices that take advantage of electrically active organic materials. These devices provide low cost, high performance alternatives to silicon-based electronic devices. One such device is the organic light emitting diode (OLED). OLED's are solid-state semiconductor devices, which implement organic semiconductor layers to convert electrical energy into light. Generally, OLEDs are fabricated by disposing multiple layers of thin films made from electroluminescent organic materials between two conductors or electrodes. The electrode layers and the organic layers are generally disposed between two substrates, such as glass or plastic. The OLEDs operate by accepting charge carriers of opposite polarities, electrons and holes, from the electrodes. An externally applied voltage drives the charge carriers into the recombination region to produce light emissions. Unlike many silicon based devices, OLEDs can be processed using low cost, large area thin film deposition processes which allow for the fabrication of ultra-thin, light weight lighting displays. Significant developments have been made in providing general area lighting implementing OLEDs.

Large area OLED devices typically combine many individual OLED devices on a single substrate or a combination of substrates with multiple individual OLED devices on each substrate. Groups of OLED devices are typically coupled in series and/or parallel to create an array of OLED devices which may be employed in display, signage or lighting applications, for instance. For these large area applications, it may be desirable to create large light emitting areas in the array while minimizing the areas that do not produce light due to defects.

Generally, a device is formed from a single layer that may contain multiple OLED devices arranged side-by-side, as the electrode material used for cathodes may not be transparent. To form different colors or to increase reliability in the devices, different devices may be connected across the surface of the device in a serial or parallel fashion. However, while the combination of many interconnected devices in the substrate layer may increase the reliability of a large area OLED device, it may limit the minimum size of an individual feature. This may provide a coarse "pixel" or large non-emissive areas that may make the production of fine features in a sign or picture difficult to display. Furthermore, the coarse pixel may be visible to the human eye, making color blending difficult, when uniform appearance is desired. Finally, the interconnections will increase the cost of a display panel, which may make it impractical for low end applications. Similarly, a pixilated display having fine features may be made from individually addressable points, connected in either a passive or an active matrix, but the complexity of the resulting panel and, thus, the cost, may limit the use to high end applications.

BRIEF DESCRIPTION

An embodiment of the present techniques provides an illuminated panel that includes a device having a cathode, a layer that includes an electroluminescent organic material in electrical contact with the cathode, and a anode in electrical contact with the layer. Both the cathode and the anode are electrically contiguous. The electroluminescent organic material includes light emitting regions of less than about 5000 micrometers in size.

Another embodiment provides a method for manufacturing a light emitting assembly, including forming one or more devices. Forming each of the one or more devices includes forming a layer comprising an electroluminescent organic material into light emitting regions of less than about 5000 micrometers in size, and placing the layer into electrical contact with an electrically contiguous anode and an electrically contiguous cathode.

Another embodiment provides a system that includes an electrical control and power unit and one or more light emitting devices configured to be individually illuminated by the electrical control and power unit. Each light emitting device includes an electrically contiguous cathode, a layer comprising one or more electroluminescent organic materials in electrical contact with the cathode, and an anode, wherein the anode is electrically contiguous and in electrical contact with the layer. The cathode, the anode, or both, are patterned to energize light emitting regions of less than about 5000 micrometers in size within the electroluminescent organic materials.

DRAWINGS

These and other features, aspects, and advantages of the present techniques will become better understood when the following detailed description is read with reference to the accompanying drawings in which like characters represent like parts throughout the drawings, wherein.

DETAILED DESCRIPTION

One or more specific embodiments of the present techniques will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Introduction

The present techniques include systems and methods for generating color tunable organic light emitting devices (OLED) from light emitting layers that have very small illuminated regions of electroluminescent organic materials, e.g., dots or lines. The illuminated regions are energized by one or more patterned electrode materials and may form designs or pictures capable of conveying information. For example, the electrode materials may be patterned by depositing small regions or structures of electrode materials, for example, through thermal deposition of the electrode material through a shadow-mask. The electrode material in any single layer may be made electrically contiguous to form a single device.

Multiple light emitting devices may be combined to form multilayer, color tunable devices wherein each device, or layer, may be illuminated either individually or simultaneously. As used in this application, the surface of a device through which light is emitted is designated as the front surface. Accordingly, designating a device as nearer indicates that it is closer to the light emitting surface than comparative devices. Similarly, designating a device as farther indicates that the device is farther from the light emitting surface than comparative devices. As electrode materials may generally be reflective or non-transparent, patterning the electrode material may allow light from farther devices to pass through areas in closer devices that do not have electrode materials deposited. For example, one of the devices, e.g., the farthest device in a multilayer structure, may have a solid electrode layer over the electroluminescent organic material which may emit light that may pass between areas where electrode materials have been deposited in devices nearer to the front surface. Such a structure may allow the color emitted from the device to be tuned by the individual energization of the farther and nearer devices.

Each light emitting layer in a multilayer structure is in a separate device containing one or more electroluminescent organic materials disposed between a negative electrode, or cathode, and a positive electrode, or anode. The electroluminescent organic materials function as organic semiconductors, forming an organic light emitting diode (OLED) that may have large surface area. Furthermore, while either one or both electrodes in each device may be patterned, each electrode is electrically contiguous, e.g., there will generally be no anode-to-cathode or series interconnections in a single layer, and, thus, each device is a single OLED. This may result in a relatively low cost panel, as no complex schemes are required for interconnecting multiple devices in each layer.

Figure 1:
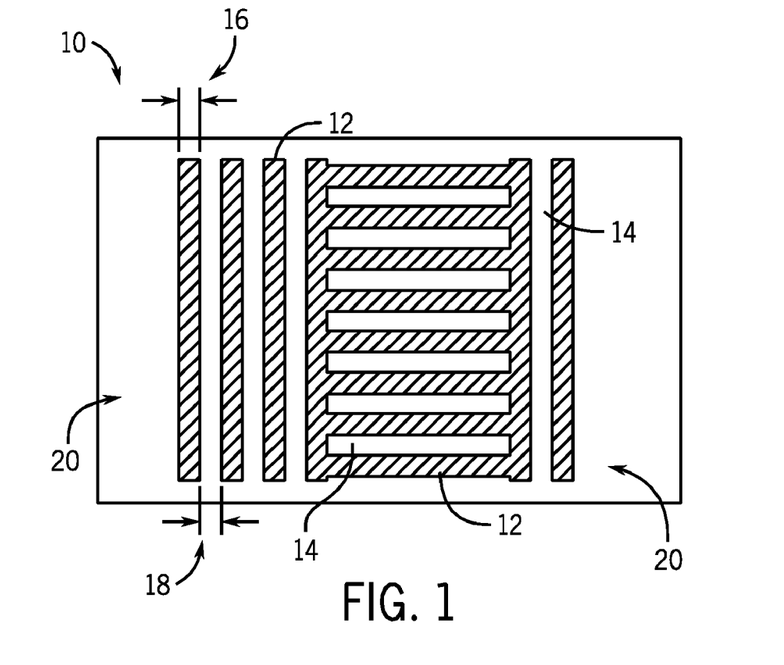
FIG. 1 is a drawing showing a top view of a device having small cathode regions that may allow light from deeper structures to be visible through the regions not covered by the cathode, in accordance with an embodiment of the present techniques.

The use of patterned electrodes to form a device may be illustrated by the top view shown in FIG. 1. This example merely illustrates one possible configuration. Any number of other configurations may also be constructed. As shown in FIG. 1, a device 10 may have electrode regions 12 made by depositing electrode materials into patterns over an electroluminescent organic material. The electrode regions 12 may alternate with empty regions 14, which may have no electrode materials deposited. Furthermore, the electrode regions 12 may be too small to be individually discernable by the human eye. For example, the size 16 of the electrode regions 12 may be as small as 50 micrometers, while in other embodiments, the size of the electrode regions may be 100 micrometers, 200 micrometers or larger, depending on the application. In other embodiments, for example, in large panels or signs that may be located some distance from a viewer, larger electrode regions 12, e.g., 500 micrometers, 1000 micrometers, or even larger, may be practical. The size of the light emitting regions may be chosen to control the properties of the colored region. For example, larger light emitting regions may be used for larger or less detailed designs, or for less color blending, while smaller light emitting regions may be used to prepare detailed designs, or smooth color blending. The empty regions 14 may be the same size 18 as the electrode regions 12, or may be larger, for example, if it is desirable to transmit more light from a lower device in a multilayer structure. In various embodiments, larger empty regions 20 that have no electrode regions 12 may allow designs to be made, for example, the formation of signs, logos, and other patterns.

The electrode regions 12 may be energized by any number of techniques. For example, the electrode regions 12 may be interconnected by a conducting layer overlaid on top of the electrode regions 12, which is not generally capable of energizing an electroluminescent organic material, as discussed with respect to FIG. 3. In another embodiment, the electrode regions 12 may be formed in a contiguous interconnected manner, such as the line pattern shown in FIG. 2, allowing energization from a single connection 22, for example, located at the edge of the device 10. The shape of the light emitting regions may be chosen as desirable for the application, the energization technique, and the deposition technique. For example, the electrode regions 12 may be formed into non-connected shapes, such as dots, using the energization techniques discussed with respect to FIG. 3.

Figure 2:
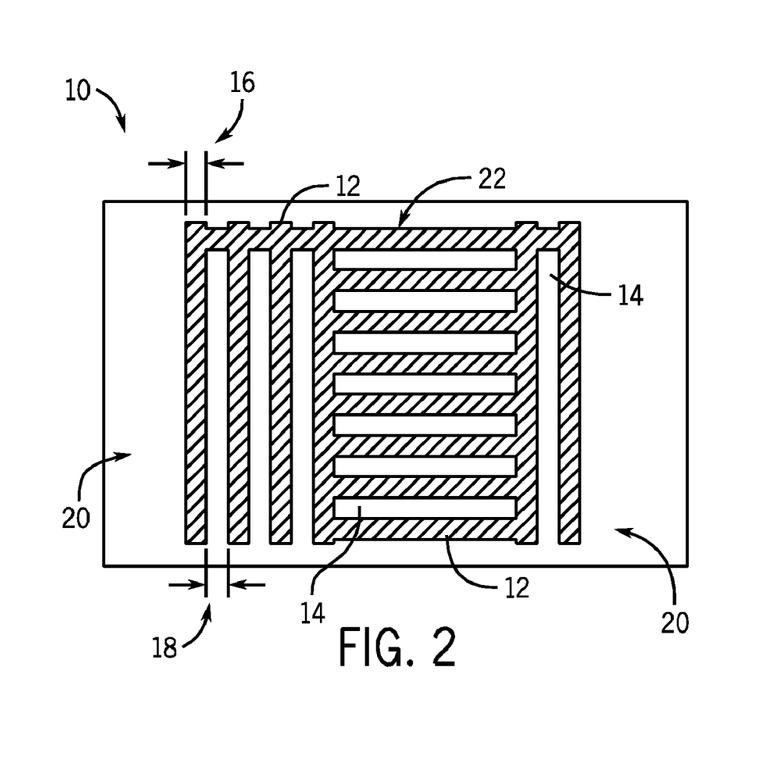
FIG. 2 is a drawing showing a top view of a device having small cathode regions that may allow light from deeper structures to be visible through the regions not covered by the cathode showing energization from an edge, in accordance with an embodiment of the present techniques.
Figures 3, 4:
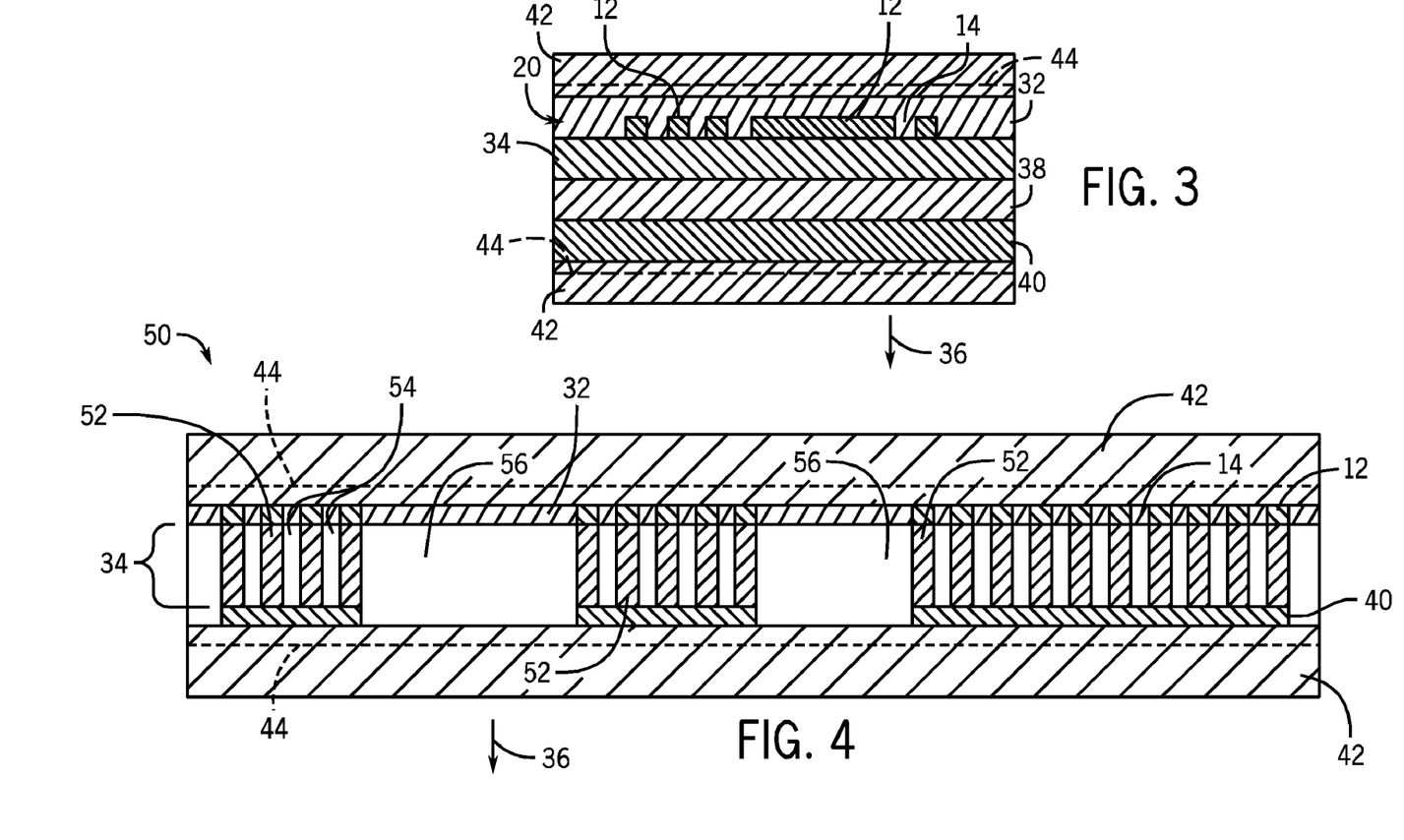
FIG. 3 is cross sectional view of the device of FIG. 1, illustrating one method for energizing unconnected electrode regions, in accordance with an embodiment of the present techniques.
FIG. 4 is cross sectional view of a device illustrating a method for illuminating regions of electroluminescent organic materials, in accordance with an embodiment of the present techniques.

FIG. 3 is a cross sectional view of a device 30, which may contain small electrode regions 12, as discussed with respect to FIGS. 1 and 2. The electrode regions 12 may not be contiguous if a conducting layer 32 is deposited over the electrode regions 12 to interconnect them. For example, a conducting layer 32 of indium tin oxide (ITO) may allow current to be directed to the electrode regions 12, but may have too high a work function, as discussed below, to act as a cathode, e.g., to transfer electrons to the electroluminescent organic material 34. The electrode regions 12 may be formed from a material with a lower work function, e.g., a layered structure of NaF and aluminum. As the electrode regions 12 may be reflective or non-transparent, emitted light 36 may generally be more visible from the side opposite the electrode regions 12.

Devices and Materials

In the embodiment illustrated in FIG. 3, the device 30 may have a single layer of electroluminescent organic material 34. In other embodiments, multiple electroluminescent materials may be used. Any number of electroluminescent organic materials may be used in the current techniques. For example, such materials may include electroluminescent organic materials tailored to emit light in a determined wavelength range. The thickness of the layer of electroluminescent organic material 34 may be greater than about 40 nanometers or may be less than about 300 nanometers. The electroluminescent organic material 34 may include, for example, polymers, copolymers, or mixtures of polymers. For example, suitable electroluminescent materials may include poly N-vinylcarbazole (PVK) and its derivatives; polyfluorene and its derivatives, such as polyalkylfluorene, for example poly-9,9-dihexylfluorene, polydioctylfluorene, or poly-9,9-bis-3,6-dioxaheptylfluorene-2,7-diyl; poly para-phenylene and its derivatives, such as poly-2-decyloxy-1,4-phenylene or poly-2,5-diheptyl-1,4-phenylene; polyp-phenylene vinylene and its derivatives, such as dialkoxy-substituted PPV and cyano-substituted PPV; polythiophene and its derivatives, such as poly-3-alkylthiophene, poly-4,4'-dialkyl-2,2'-bithiophene, poly-2,5-thienylene vinylene; polypyridine vinylene and its derivatives; polyquinoxaline and its derivatives; and polyquinoline and its derivatives. In one embodiment, a suitable electroluminescent material is poly-9,9-dioctylfluorenyl-2,7-diyl end capped with N,N-bis 4-methylphenyl-4-aniline. Mixtures of these polymers or copolymers based on one or more of these polymers may be used.

Other suitable materials that may be used as the electroluminescent organic material 34 include polysilanes. Polysilanes are linear polymers having a silicon-backbone substituted with an alkyl and/or aryl side groups. Polysilanes are quasi one-dimensional materials with delocalized sigma-conjugated electrons along polymer backbone chains. Examples of polysilanes include poly di-n-butylsilane, poly di-n-pentylsilane, poly di-n-hexylsilane, polymethyl phenylsilane, and poly bis p-butyl phenylsilane.

In one embodiment, organic materials having molecular weight less than about 5000, including aromatic units, may be used as the electroluminescent organic material 34. An example of such materials is 1,3,5-tris[N-(4-diphenyl aminophenyl) phenylamino] benzene, which emits light in the wavelength range of from about 380 nanometers to about 500 nanometers. These electroluminescent materials may be prepared from organic molecules such as phenylanthracene, tetraarylethene, coumarin, rubrene, tetraphenylbutadiene, anthracene, perylene, coronene, or their derivatives. The materials may emit light having a maximum wavelength of about 520 nanometers. Still other suitable materials are the low molecular-weight metal organic complexes such as aluminum-acetylacetonate, gallium-acetylacetonate, and indium-acetylacetonate, which emit light in the wavelength range of about 415 nanometers to about 457 nanometers, aluminum picolymethylketone bis-2,6-dibutylphenoxide or scandium-4-methoxy picolyl methyl ketone-bis acetyl acetonate, which emit light having a wavelength in a range of from about 420 nanometers to about 433 nanometers. Other suitable materials that emit in the visible wavelength range may include organo-metallic complexes of 8-hydroxyquinoline, such as tris-8-quinolinolato aluminum and its derivatives.

The electroluminescent organic material 34 may optionally be in contact with one or more non-emissive materials in adjacent layers. These non-emissive layers may improve the performance or lifespan of the electroluminescent materials. The non-emissive layers may include, for example, a charge transport layer, a hole transport layer, a hole injection layer, a hole injection enhancement layer, an electron transport layer, an electron injection layer, an electron injection enhancement layer, or any combinations thereof. For example, a charge transport layer 38 is illustrated in the cross section of FIG. 3. Other embodiments may include other layers (not shown).

Non-limiting examples of materials suitable for use as the charge transport layer 38 may include low-to-intermediate molecular weight organic polymers, for example, organic polymers having weight average molecular weights of less than about 200,000 grams per mole as determined using polystyrene standards. Such polymers may include, for example, poly-3,4-ethylene dioxy thiophene (PEDOT), polyaniline, poly-3,4-propylene dioxythiophene (PProDOT), polystyrene sulfonate (PSS), polyvinyl carbazole (PVK), and other like materials, and combinations thereof.

Non-limiting examples of materials suitable for the hole-transport layer may include triaryldiamines, tetraphenyldiamines, aromatic tertiary amines, hydrazone derivatives, carbazole derivatives, triazole derivatives, imidazole derivatives, oxadiazole derivatives including an amino group, polythiophenes, and like materials. Non-limiting examples of materials suitable for a hole-blocking layer may include poly N-vinyl carbazole, and like materials.

Non-limiting examples of materials suitable for hole-injection layers may include "p-doped" proton-doped conducting polymers, such as proton-doped polythiophene or polyaniline, and p-doped organic semiconductors, such as tetrafluorotetracyanoquinodimethane (F4-TCQN), doped organic and polymeric semiconductors, and triarylamine-containing compounds and polymers. Non-limiting examples of electron-injection materials may include polyfluorene and its derivatives, aluminum tris-8-hydroxyquinoline (Alq3), organic/polymeric semiconductors n-doped with alkali alkaline earth metals, and the like. Non-limiting examples of materials suitable for a hole injection enhancement layer may include arylene-based compounds such as 3,4,9,10-perylene tetra-carboxylic dianhydride, bis-1,2,5-thiadiazolo-p-quino bis-1,3-dithiole, and like materials.

The device 30 also has an anode 40. The anode 40 is electrically contiguous across the device 30, e.g., allowing the formation of a single electrical unit in which all of the electroluminescent organic material 34 is powered by a single current flowing between the anode 40 and the cathode, e.g., electrode regions 12. Although the anode 40 is electrically contiguous, it may also be deposited in a pattern to energize some regions in the device, while leaving other regions unpowered, as discussed with respect to FIG. 4, below. Generally, materials used for the anode 40 may have a high work function, e.g., greater than about 4.0 electron volts. Suitable materials that may be suitable include, for example, indium tin oxide (ITO), tin oxide, indium oxide, zinc oxide, indium zinc oxide, zinc indium tin oxide, antimony oxide, and mixtures thereof. The thickness of an anode 40 including such an electrically conducting oxide may, generally, be greater than about 10 nanometers. In various embodiments, the thickness may be in the range of from about 10 nanometers to about 50 nanometers, from about 50 nanometers to about 100 nanometers, or from about 100 nanometers to about 200 nanometers.

A thin transparent layer of a metal may also be suitable for the anode 40. The metal layer may have a thickness, for example, of less than or equal to about 50 nanometers. In various embodiments, the metal thickness may be in a range of from about 50 nanometers to about 20 nanometers. Suitable metals for the anode 40 may include, for example, silver, copper, tungsten, nickel, cobalt, iron, selenium, germanium, gold, platinum, aluminum, or mixtures thereof or alloys thereof. The anode 40 may be deposited on the underlying element by a technique such as physical vapor deposition, chemical vapor deposition, or sputtering.

One type of anode 40 that may be used in embodiments of the present techniques may be formed from a deposited layer of indium-tin-oxide (ITO) between about 60 and 150 nm in thickness. The ITO layer may be about 60 to 100 nm in thickness, or may be about 70 nm thick. The thickness of the anode 40 may be determined by the balance between the transparency and the conductivity. A thinner anode 40 may be more transparent, allowing more light from lower layers to be passed through. In contrast, a thicker anode 40, may block more light, but have improved conductivity, which may increase the lifespan of the device 30. The thickness of the anode 40 may also depend on the location of the device 30 in a multilayer structure. For example, an anode 40 in a nearer device may be made thinner than an anode 40 in, for example, a farther device.

The device 30 also has a cathode, e.g., the electrode regions 12. The cathode may generally be made from metallic materials having a low work function, e.g., less than about 4 electron volts. Not every material suitable for use as the cathode need have a low work function. Materials suitable for use as the cathode may include K, Li, Na, Mg, Ca, Sr, Ba, Al, Ag, In, Sn, Zn, Zr, Sc, and Y. Other suitable materials may include elements of the lanthanide series, alloys thereof, or mixtures thereof. Examples of suitable alloy materials for the manufacture of the cathode may include Ag—Mg, Al—Li, In—Mg, and Al—Ca alloys. Layered, non-alloyed structures may also be used. Such layered non-alloyed structures may include a thin layer of a metal such as Ca having a thickness in a range of from about 1 nanometer to about 50 nanometers. Other such layered non-alloy structures may include a non-metal such as LiF, KF, or NaF, over-capped by a thicker layer of some other metal. Such suitable metals may include aluminum or silver. The cathode may be deposited on the underlying layer by, for example, physical vapor deposition, chemical vapor deposition, or sputtering. To form the patterns of the electrode regions 12, the materials may be deposited over a shadow-mask, which may block deposition in the empty regions 14 and the larger empty regions 20 used to form a pattern.

One material combination that may be used to form a very thin and, thus, more transparent, cathode may have a first layer made from silver of about 7.5 to 15 nm thick, or about 10 nm thick. A layer made from barium of about 2.5 to 6.5 nm in thickness may be deposited underneath the silver layer and be in contact with the electroluminescent organic material 34. The barium layer may be about 3 to 4 nm thick. In combination with the patterned electrode regions 12, such a transparent electrode may further assist in the formation of multilayer structures by allowing light from devices farther from the front of a structure to more easily reach a viewer.

Materials that may be used to form conductive layer 32 may include electrically conductive materials that possess transparency when forming a thin layer, such as poly-3,4-ethylene dioxy thiophene (PEDOT), polyaniline, poly-3,4-propylene dioxythiophene (PProDOT), polystyrene sulfonate (PSS), polyvinyl carbazole (PVK), AlQ3, and other like materials. Other materials that may be suitable include, for example, indium tin oxide (ITO), tin oxide, indium oxide, zinc oxide, indium zinc oxide, zinc indium tin oxide, antimony oxide, and mixtures thereof. Thin transparent layers of metal, such as gold, silver, copper, tungsten, nickel, cobalt, iron, selenium, germanium, gold, platinum, aluminum, or mixtures thereof or alloys thereof, or thin layers of carbon nanotubes, graphene, or similar materials may also be used. Generally, the materials that may be used to form conductive layer 32 may have a high work function, which allows the conductive layer to carry current to the electrode regions 12, while not directly energizing the electroluminescent organic material 34.

The anode 40 and electrode regions 12 may be supported by a respective substrate 42. The substrate 42 may be the same material for the front and back of the device 30, or different materials may be selected. Generally, two classes of materials may be used for the substrate 42, inorganic materials and organic materials. Inorganic materials, e.g., glass, may be very transparent and may also function as a barrier layer, preventing oxygen from degrading the organic materials. However, inorganic materials may be brittle (if thick), inflexible, fragile, and/or heavy. To overcome these disadvantages, plastic may be used for the substrate 42. Non-limiting examples of materials that may be used for the substrate 42 include inorganic glasses, ceramic foils, polymeric materials, filled polymeric materials, coated metallic foils, acrylics, epoxies, polyamides, polycarbonates, polyimides, polyketones, polyoxy-1,4-phenyleneoxy-1,4-phenylenecarbonyl-1,4-phenylene sometimes referred to as polyether ether ketone or (PEEK), polynorbornenes, polyphenyleneoxides, polyethylene naphthalenedicarboxylate (PEN), polyethylene terephthalate (PET), polyether sulfone (PES), polyphenylene sulfide (PPS), and fiber-reinforced plastics (FRP). In one embodiment the substrates may be flexible. Flexible substrates may also be formed from thin metal foils such as stainless steel provided they are coated with an insulating layer to electrically isolate the metal foil from the anode 40 (unless the metal foil is functioning as the anode 40).

Deposition of the materials used to form the device 30, such as the electrode regions 12, the anode 40, the electroluminescent organic materials 34, the charge transport layer 38, or any of the layers discussed below, may be performed using techniques such as, but not limited to, spin coating, dip coating, reverse roll coating, wire-wound or Mayer rod coating, direct and offset gravure coating, slot die coating, blade coating, hot melt coating, curtain coating, knife over roll coating, extrusion, air knife coating, spray, rotary screen coating, multilayer slide coating, coextrusion, meniscus coating, comma and microgravure coating, lithographic process, Langmuir process and flash evaporation, thermal or electron-beam assisted evaporation, vapor deposition, plasma-enhanced chemical-vapor deposition ("PECVD"), radio-frequency plasma-enhanced chemical-vapor deposition ("RF-PECVD"), expanding thermal-plasma chemical-vapor deposition ("ETPCVD"), sputtering including, but not limited to, reactive sputtering, electron-cyclotron-resonance plasma-enhanced chemical-vapor deposition (ECRPECVD"), inductively coupled plasma-enhanced chemical-vapor deposition ("ICPECVD"), and combinations thereof. For example, deposition of the electrode regions 12, may be performed by thermal evaporation of the materials, followed by deposition over the electroluminescent organic material 34 using a shadow-mask to prevent layer formation in empty regions 14.

If the outermost layer of the device 30, for example, either the front or back substrate 42 is plastic, the barrier properties may be improved to protect the electroluminescent organic material 34, among others, from degradation caused by oxygen or water vapor diffusing through the plastic and, thus, extend the lifespan of the device. For example, a barrier coating 44 may be disposed on or impregnated into the substrate 42, such that the barrier coating 44 completely covers the substrate 42. The barrier coating 44 may prevent moisture and oxygen diffusion through the substrate 42. Further, the barrier coating 44 used in a front surface does not have to be the same as that which may be used in a back surface of the device 30. For example, if a back surface is layered with a metal foil, a barrier coating 44 may not be needed.

The barrier coating 44 may have a thickness ranging from about 10 nm to about 10,000 nm, or in a range from about 10 nm to about 1,000 nm. The thickness of the barrier coating 44 may be selected so as not to impede the transmission of light through the substrate 42, such as a layer of barrier coating 44 that causes a reduction in light transmission of less than about 20% or less than about 5%. The barrier coating 44 material and thickness may also be controlled to retain the flexibility of the substrate 42, without a significantly degradation with bending. As discussed in further detail below, the barrier coating 44 may include any suitable reaction or recombination products for reacting species.

The barrier coating 44 may include materials such as, but not limited to, organic material, inorganic material, ceramics, metals, or combinations thereof. Typically, these materials are reaction or recombination products of reacting plasma species that may be deposited on the substrate 42 from the plasma. In certain embodiments, the organic materials may comprise carbon, hydrogen, oxygen and optionally, other minor elements, such as sulfur, nitrogen, silicon, etc., depending on the types of reactants. Suitable reactants that result in organic compositions in the coating are straight or branched alkanes, alkenes, alkynes, alcohols, aldehydes, ethers, alkylene oxides, aromatics, etc., having up to 15 carbon atoms. Inorganic and ceramic coating materials typically comprise oxide, nitride, carbide, boride, oxynitride, oxycarbide, or combinations thereof of elements of Groups IIA, IIIA, IVA, VA, VIA, VIIA, IB, and IIB; metals of Groups IIIB, IVB, and VB, and rare-earth metals. For example, silicon carbide can be deposited onto the substrate 42 by recombination of plasmas generated from silane ($SiH_4$) and an organic material, such as methane or xylene. Silicon oxycarbide can be deposited from plasmas generated from silane, methane, and oxygen or silane and propylene oxide. Silicon oxycarbide also can be deposited from plasmas generated from organosilicone precursors, such as tetraethoxysilane (TEOS), hexamethyldisiloxane (HMDSO), hexamethyldisilazane (HMDSN), or octamethylcyclotetrasiloxane (D4). Silicon nitride can be deposited from plasmas generated from silane and ammonia. Aluminum oxycarbonitride can be deposited from a plasma generated from a mixture of aluminum titrate and ammonia. Other combinations of reactants, such as metal oxides, metal nitrides, metal oxynitrides, silicon oxide, silicon nitride, silicon oxynitrides may be chosen to obtain a desired coating composition.

In other embodiments, the barrier coating 44 may comprise hybrid organic/inorganic materials or multilayer organic/inorganic materials. The organic materials may comprise acrylates, epoxies, epoxyamines, xylenes, siloxanes, silicones, etc. Most metals may also be suitable for the barrier coating 44 in applications where transparency of the substrate 42 is not required, for example, when the substrate 42 is used as the back surface of the device 30. Further, the barrier coating 44 may be provided on the inner surface of the substrate 42, directly adjacent to an electrode, or the barrier coating 44 may be on the outer surface of the substrate 42. Other barrier layers may be used under the appropriate circumstances. For example, a reflective foil layer attached under the back layer of the back device may function as a barrier layer. Further, a thin glass sheet, either optically transparent or somewhat opaque, attached over the front layer of the front device may also function as a barrier layer.

In one embodiment, the device 30 may be made by first forming a barrier coating 44 over a plastic substrate 42. Over the barrier coating 44, an anode 40, e.g., indium tin oxide (ITO), may be deposited using any of the techniques discussed above, such as sputtering. One or more layers of organic materials may be deposited over the anode 40. These layers may include the charge transport layer 38 and the electroluminescent organic material 34, among others. In various embodiments, these layers, or additional organic layer, may be formed into patterns, for example, by using printing processes, such as rotogravure, jet printing, and the like. Over the organic materials the electrode regions 12, e.g., NaF/Ag, barium, silver, and the like, may be deposited using various techniques, for example, thermal vapor deposition over a shadow-mask to form a pattern. As noted above, a conducting layer 32, e.g., ITO or another high work function material, may be deposited over the electrode regions 12 to form the cathode. Finally, another substrate 42 having a barrier coating 44 may be affixed over the cathode. The anode 40 and the conducting layer 32 may then be connected to power leads (not shown).

In addition to patterning the electrode regions 12 of the cathode, the anode 40 may also be patterned, as illustrated by the cross sectional view in FIG. 4. In FIG. 4 a first device 50 is shown. For clarity, in FIGS. 4-7, the hole transport layer 38 is not shown, however, this layer, or any of the other layers discussed above, may optionally be present. In this embodiment, both the anode 40 and the cathode, e.g., the electrode regions 12, may be patterned. Accordingly, upon energization, the electroluminescent organic material 34 located between the anode 40 and the electrode regions 12 of the cathode may be light emitting 52. However, regions of the electroluminescent organic material 34 that do not have an active electrode region 12, as indicated by reference numeral 54, may not be illuminated. As discussed with respect to FIG. 3, the electrode regions 12 may be electrically connected and energized by a layer 32 of ITO, which may not energize the electroluminescent materials 34. Similarly, regions of the electroluminescent organic materials 34 that do not have an active anode 40, indicated by reference numeral 56 may also be non-illuminated. As for device 30, discussed with respect to FIG. 3, the emitted light 36 from the device may be brightest opposite the generally reflective electrode regions 12 of the cathode.

The patterning of the anode 40 may be similar to that for the electrode regions 12 of the cathode, e.g., with contiguous intersecting lines that allow the anode 40 to be powered from a single connection at the edge. Further, the lines of the anode may be perpendicular to the lines of the electrode regions 12 of the cathode, creating rectangular illuminated regions in the electroluminescent organic material 34.

Figure 5:
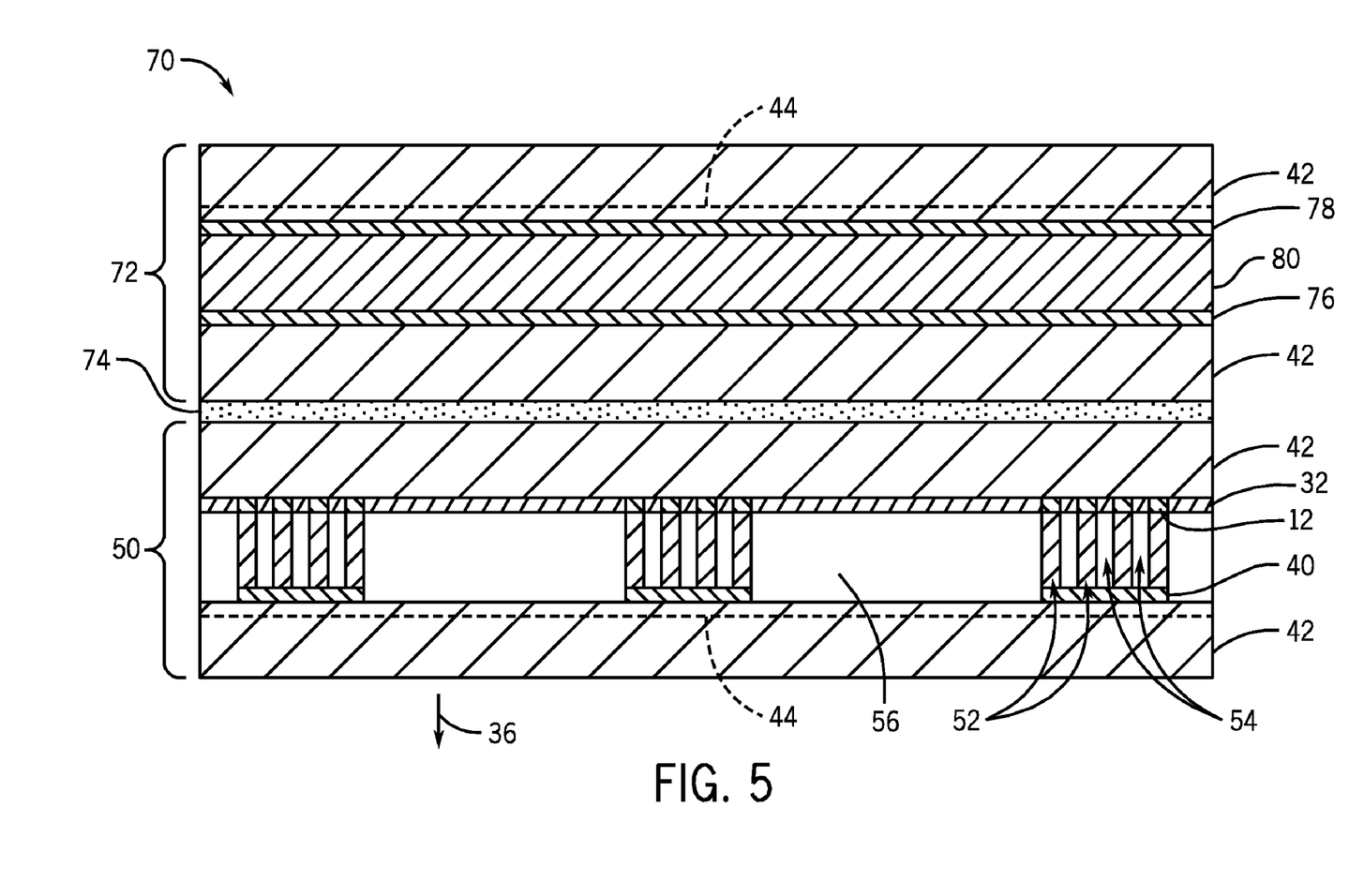
FIG. 5 is a cross sectional view of two devices formed into a single multilayer structure, in accordance with an embodiment of the present techniques.

As shown in the cross-section of FIG. 5, a multilayer structure 70 may be created by joining a second device 72 to the first device 50 discussed with respect to FIG. 4, above. The devices 50, 72 may be stacked together to create the multilayer structure 70 using any number of possible techniques. For example, the devices may be joined by a connecting layer 74 disposed between the devices 50, 72. The connecting layer 74 may be an optical adhesive, selected to match the refractive index of the materials used in the substrate 42 and, thus, minimize light loss due to reflections at the interfaces between materials. Alternatively, the connecting layer 74 may be an oil with a refractive index matching the substrate 42. In this example, the oil is only used to match the refractive indices, and may not be used for holding the devices together, which may be accomplished by the packaging, further described and illustrated with regard to FIG. 7.

One skilled in the art will recognize that, depending on the materials used in the substrate 42, any number of other techniques may be used to join the devices 50, 72, including solvent bonding, ultrasonic welding, heat lamination, or any other technique used in the art for joining surfaces. In some embodiments, the devices 50, 72 may be merely held together by the physical packaging, with no oil or other refractive index matching compounds. While this may decrease the efficiency of light transmission from low devices, the loss may not be significant in some applications.

The second device 72 may be formed using the same materials as discussed with respect to the device 30, discussed with respect to FIG. 3, above. Further, the second device 72 may have a anode 76 and a cathode 78 that are independent of the anode 40 and electrode regions 12 of the first device 50, allowing for independent illumination. Accordingly, the second device 72 may allow for tuning the color of an OLED panel, or for conveying information, providing artistic effects, and the like.

For example, as shown in the embodiment of FIG. 5, the second device 72 may have a solid layer 80 of electroluminescent organic material, providing a single color useful as a background for the device 70. If the electrode regions 12 of the first device 50 are regularly spaced across the entire surface, the multilayer structure 70 may be useful as a tunable light source, with light emitted from the second device 72 emitted between the gaps in the electrode regions 12 of the first device 50. In other embodiments, the first device 50 may have a design, such as a picture, a logo, or the like, and the solid color of the second device 72 may provide a contrasting background. In yet other embodiments, additional devices may be incorporated, each having individual designs useful for conveying additional information.

Figure 6:
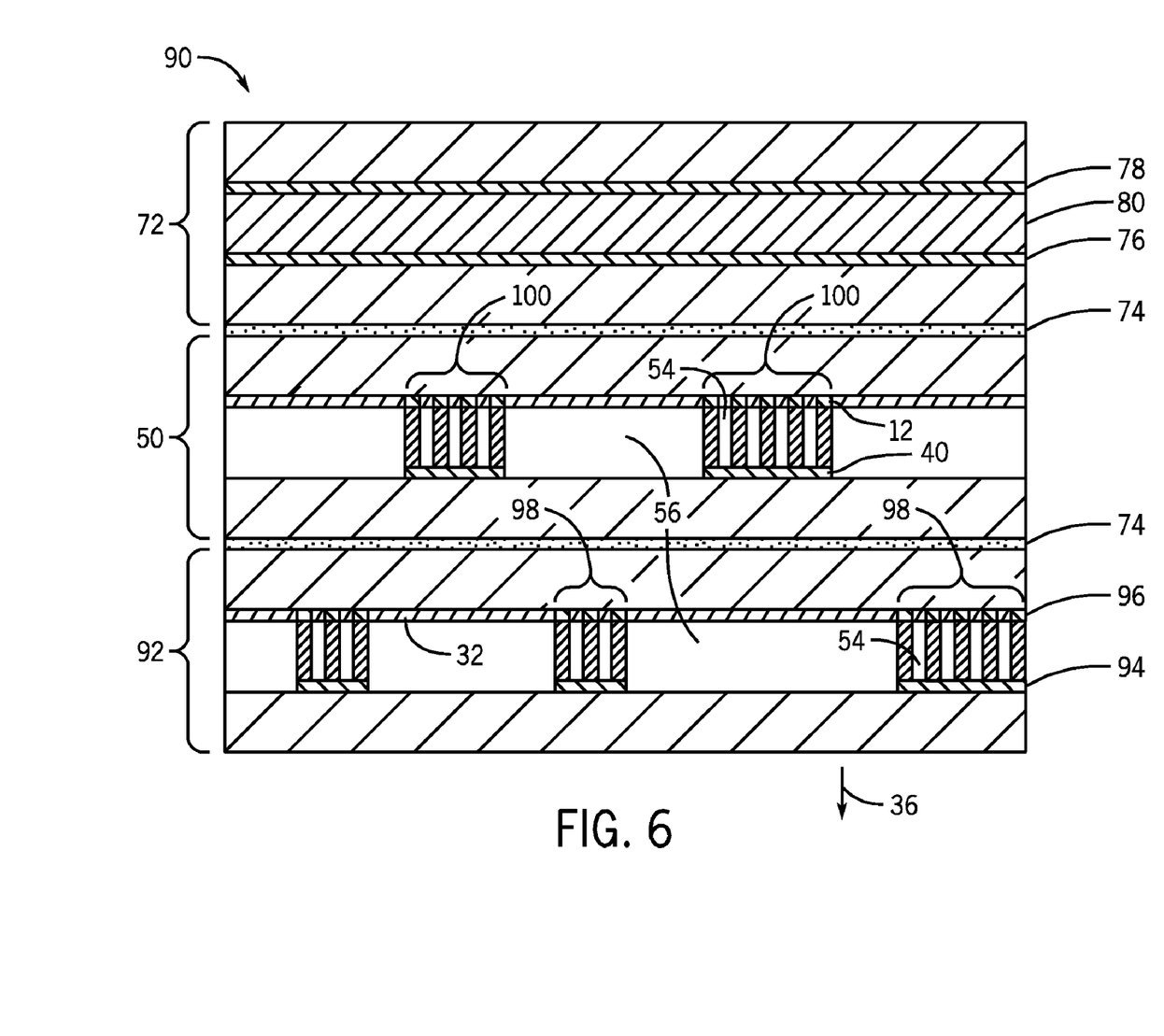
FIG. 6 is a cross section of a multilayer structure made from three devices, in accordance with an embodiment of the present techniques.

For example, the cross section shown in FIG. 6 illustrates a second multilayer structure 90 that has a third device 92 joined to the first device 50 and the second device 72. As for the second device 72, the third device 92, and any subsequent devices, may include the same design and materials as discussed above with respect to FIG. 3. The materials chosen for each device 50, 72, 92 may be independent of the other devices. As discussed with respect to FIG. 5, the outermost layers of the substrate 42 may include a barrier layer (not shown) to protect the electroluminescent organic material 34 from degradation. These barrier layers may be formed on the inner or outer surface of the respective substrates 40.

In some embodiments, the third device 92 may be formed using patterned electrodes, as discussed above. Further, the anode 94 and cathode 96 of the third device 92 may be independent of the first device 50 and the second device 72, allowing the third device 92 to be independently illuminated. In some embodiments, the light emitting regions 98 of the third device 92 may be regularly spaced to create a tunable light source, with light from the second device 72 shining through the gaps in the cathodes of the first device 50 and third device 92. In other embodiments, the light emitting regions 98 may be arranged to form a design such as a picture, logo, or sign, among others. This design may be illuminated simultaneously with the design formed by the light emitting regions 100 of the first device 50, or may be independently illuminated.

Systems Using Multilayer Panels

Figure 7:
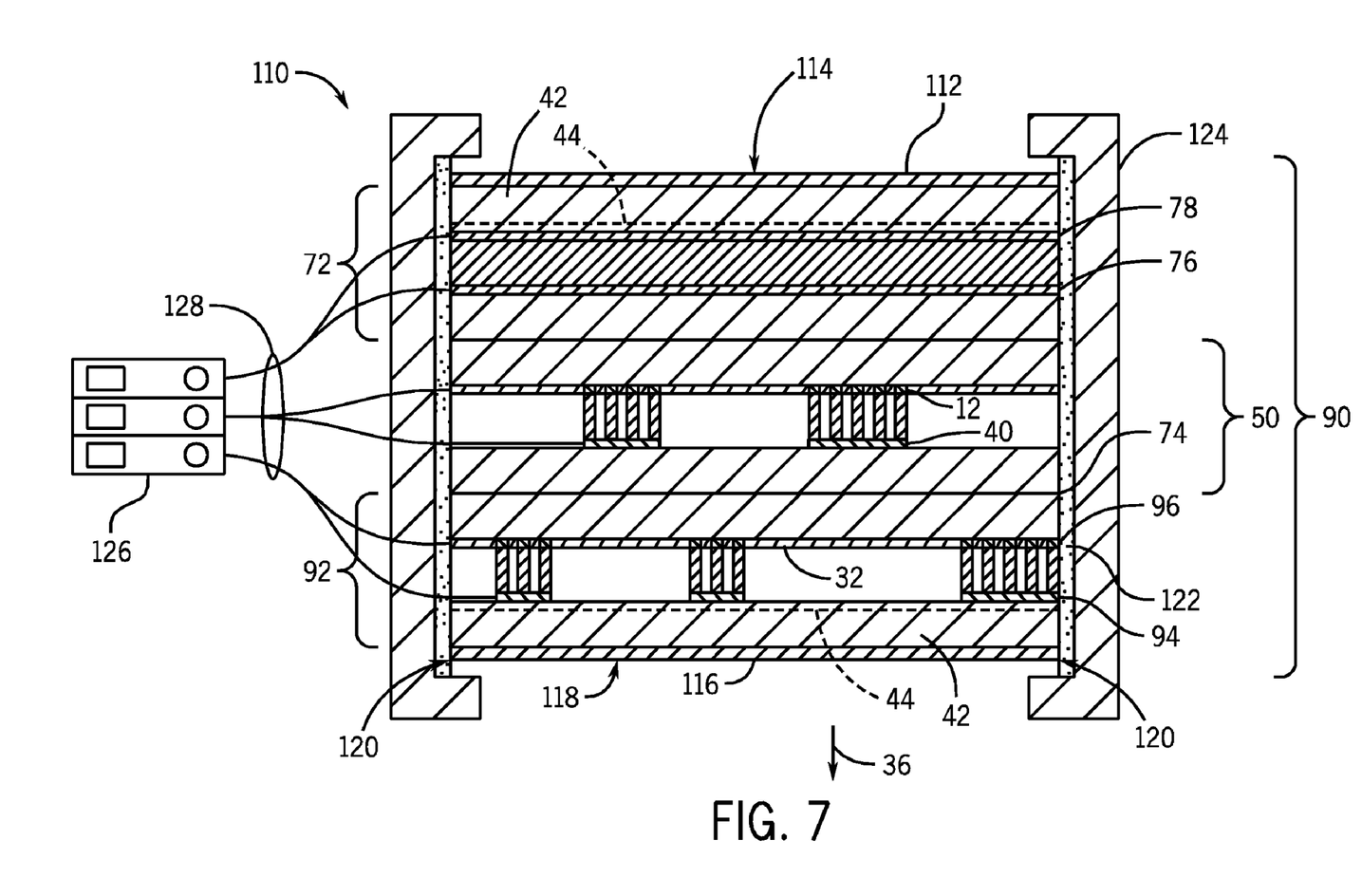
FIG. 7 is a cross sectional view of a complete color tunable OLED system, in accordance with an embodiment of the present techniques.

After the individual devices, e.g., the first device 50, the second device 72, and the third device 92, have been stacked and/or joined together, the resulting multilayer structure 90 may be incorporated into a final display system 110, an example of which may be seen in the cross section illustrated in FIG. 7. In FIG. 7, the multilayer structure 90 may have a reflective layer 112, e.g., a metal foil, placed on the back surface 114 of the structure to reflect light toward the front surface 118 where it is emitted 36. Materials that are suitable for the metal foil may include aluminum foil, stainless steel foil, copper foil, tin, Kovar, Invar, and similar materials. In other embodiments, the cathode 78 of the third device 72 may be sufficiently reflective. A diffuser panel 116 may be located on the front surface 118 to scatter the light from the individual devices, blending light emitted from the individual devices 50, 72, 92.

As discussed with respect to FIG. 3, above, the front surface 118 and the back surface 114 of the multilayer structure 90 may be hermetically sealed to prevent oxygen infiltration from damaging the organic materials, e.g., the electroluminescent organic material 34 or the charge transport layer 38. For example, as discussed above with respect to FIG. 3, a substrate 42 may have a barrier coating 44 impregnated into a surface. If this is done for the substrate 42 of the front surface 118 and the back surface 114 of the multilayer structure 90, this may protect the organic materials. Alternatively, in embodiments in which the rear surface 114 has a reflective layer 112, for example, a metal foil, the reflective layer 112 may provide sufficient protection from moisture and oxygen infiltration. Similarly, if a diffuser panel 116 attached to the front surface 118 of the multilayer structure 90 is made from glass, or other impregnable materials, it may provide sufficient protection for the organic materials without further treatment of the substrate 42 of the front surface 118.

While the techniques discussed above may protect the organic materials in the devices 50, 72, 92 from diffusion of oxygen through the front surface 118 or back surface 114 of the multilayer structure 90, diffusion of oxygen or moisture vapor from the edge 120 of the multilayer structure 90 may still degrade the organic materials. Accordingly, the edge 120 may be sealed to prevent this infiltration. Any number of techniques may be used to seal the edge of the panel.

For example, an impermeable adhesive 122 may be used to seal the edge 120 of the multilayer structure 90. The impermeable adhesive 122 may include, for example, a silicon RTV compound, a polyurethane, a polyimide, an epoxy, a polyacrylamide, or any similar sealant or combination of sealants. These may be used in neat form or may be filled by the addition of impermeable fillers, such as, for example, glass particles, metal particles, and the like. Further, an edging material 124, which may be plastic, metal, or any other material, may be placed around the multilayer structure 90, and may be held in place and sealed by the impermeable adhesive 122. Any number of other techniques may be used to seal the edges of the multilayer structure 90. For example, a metal alloy sealant may be disposed about the entire perimeter of the multilayer structure 90 such that the electroluminescent organic materials are completely surrounded by the metal alloy sealant. Further, any combination of these techniques may be used. For example, an edging material 124 may be layered over a metal alloy sealant, and held in place by an impermeable adhesive 122.

The multilayer structure 90 may be connected to a controller 126 by lines 128 connected to the anode and cathode of each device, e.g., the first device 50, the second device 72, and the third device 92. The controller 126 may be configured to power each device either individually or simultaneously with other devices so that one or more of the designs are concurrently visible. The amount of energy applied to each device may be controlled to change the amount or color of the illumination provided by the multilayer structure 90. This could be used, for example, to tune the color of the multilayer structure 90. In other embodiments, the amount of energy applied could be used to adjust the illumination of a picture or sign for the ambient lighting conditions, making the sign more visible during bright conditions.

While only certain features of the techniques have been illustrated and described herein, many modifications and changes will occur to those skilled in the art. It is, therefore, to be understood that the appended claims are intended to cover all such modifications and changes as fall within the true spirit of the techniques.

What is claimed is:

1. An illuminated panel, comprising:
   a first device, wherein the first device comprises:
      a cathode, wherein the cathode is electrically contiguous;
      a layer comprising an electroluminescent organic material in electrical contact with the cathode; and
      an anode, wherein the anode is electrically contiguous, and wherein the anode is in electrical contact with the layer,
      wherein at least one of the cathode or the anode is patterned to define more than one electrode region each having a lateral dimension of less than about 5000 micrometers and thereby define light emitting regions within the layer when energized; and
   a second device, wherein the second device comprises:
      a second cathode, wherein the second cathode is electrically contiguous;
      a second layer comprising a second electroluminescent organic materials in electrical contact with the second cathode; and
      a second anode, wherein the second anode is electrically contiguous, and in electrical contact with the second layer,
      wherein the first device is joined to the second device in a stacked configuration to form a multilayer structure, and wherein the first device and the second device are configured to be individually energized.

2. The illuminated panel of claim 1, wherein at least one of the cathode, the layer, or the anode is patterned to form a design configured to be illuminated.

3. The illuminated panel of claim 2, wherein the cathode comprises:
   two or more non-contiguous electrode regions, configured to substantially energize the electroluminescent organic material; and
   a conducting layer deposited over the non-contiguous electrode regions, wherein the conducting layer is configured to conduct current to the non-contiguous electrode regions while not substantially energizing the electroluminescent organic material.

4. The illuminated panel of claim 1, wherein the light emitting regions are less than about 100 micrometers in a lateral dimension.

5. The illuminated panel of claim 1, wherein the illuminated panel is configured to provide a color tunable light source.

6. The illuminated panel of claim 1, comprising:
   a third device, wherein the third device comprises:
      a third cathode, wherein the third cathode is electrically contiguous;
      a third layer comprising a third electroluminescent organic material in electrical contact with the third cathode; and
      a third anode, wherein the third anode is electrically contiguous, and in electrical contact with the third layer, wherein at least one of the third cathode, the third layer, or the third anode is patterned to form a second design configured to be illuminated, wherein at least one of the third cathode or the third anode is patterned to define one or more electrode regions each having a lateral dimension of less than about 5000 micrometers and thereby define light emitting regions within the third layer when energized, wherein the third device is joined to the first and second device to form the multilayer structure, and wherein the first device, the second device, and the third device are configured to be individually energized.

7. The illuminated panel of claim 6, wherein the illuminated panel is configured to provide a color tunable light source.

8. The illuminated panel of claim 6, wherein the third cathode comprises:
   two or more non-contiguous electrode regions, configured to substantially energize the third electroluminescent organic material; and
   a conducting layer deposited over the non-contiguous electrode regions, wherein the conducting layer is configured to conduct current to the non-contiguous electrode regions while not substantially energizing the third electroluminescent organic material.

9. The illuminated panel of claim 6, wherein at least one of the first anode, the second anode, or the third anode comprises a layer of indium-tin-oxide (ITO) between about 60 nm and 150 nm thick.

10. The illuminated panel of claim 6, wherein the first design and the second design comprise different color layers of a picture, design, logo, or pattern, or any combination thereof.

11. The illuminated panel of claim 6, wherein either the first cathode, the third cathode, or both, comprise a pattern formed from intersecting lines of electrode material configured to be energized from a single electrical connection.

12. The illuminated panel of claim 6, wherein the electroluminescent organic material comprises at least one electroluminescent polymer or electroluminescent polymer derivative that is selected from the group consisting of polyfluorene, poly(phenylene vinylene), and poly(vinyl carbazole).

13. The illuminated panel of claim 6, wherein the electroluminescent organic material comprises organometallic compounds.

14. The illuminated panel of claim 6, wherein the first cathode, the second cathode, the third cathode, or any combination thereof, are configured to be substantially transparent to light.

15. The illuminated panel of claim 6, wherein either the first layer, the second layer, the third layer, or any combination thereof, comprise one or more of a hole transport layer, a hole injection layer, an electron transport layer, an electron injection layer, or an electro-luminescent layer.

16. The illuminated panel of claim 6, comprising sealing the multilayer structure in a hermetically sealed package.

17. A method for manufacturing a light emitting assembly, comprising:
   forming two or more devices joined together in a stacked configuration to form a multilayer structure where each of the two or more devices is configured to be individually energized, wherein forming each of the two or more devices comprises:
      forming a layer comprising an electroluminescent organic material; and
      placing the layer into electrical contact with an electrically contiguous anode and an electrically contiguous cathode, wherein the anode, the cathode, or both, are patterned to define more than one electrode region each having a lateral dimension of less than about 5000 micrometers and thereby define light emitting regions within the layer when energized.

18. The method of claim 17, comprising forming patterns in the anode, the cathode, or both, to energize light emitting regions in the electroluminescent organic material into light emitting regions of less than about 100 micrometers in a lateral dimension.

19. The method of claim 17, comprising forming the cathode by:
   depositing two or more non-contiguous electrode regions over the electroluminescent organic material, wherein the electrode regions are configured to substantially energize the electroluminescent organic material; and
   depositing a conducting layer over the two or more non-contiguous electrode regions, wherein the conducting layer is configured to conduct current to the electrode regions, and the conducting layer is configured to not substantially energize the electroluminescent organic material.

20. The method of claim 17, comprising:
   forming a backlight device, wherein forming the backlight device comprises:
      forming a backlight cathode, wherein the backlight cathode is electrically contiguous;
      forming a backlight layer comprising a backlight electroluminescent organic material in electrical contact with the backlight cathode; and
      forming a backlight anode, wherein the backlight anode is electrically contiguous and in electrical contact with the backlight layer; and
      joining the backlight device to the one or more devices to form a layered structure, wherein each of the devices is configured to be individually illuminated.

21. The method of claim 17, comprising forming the light emitting regions into patterns comprising designs, photographs, letters, or any combination thereof.

22. A system, comprising:
   an electrical control and power unit; and
   two or more light emitting devices configured to be illuminated by the electrical control and power unit, wherein the two or more light emitting devices are joined together in a stacked configuration to form a multilayer structure, and wherein each of the two or more light emitting devices is configured to be individually energized and comprises:
      a cathode, wherein the cathode is electrically contiguous;
      a layer comprising an electroluminescent organic material in electrical contact with the cathode; and
      an anode, wherein the anode is electrically contiguous and in electrical contact with the layer, and wherein the cathode, the anode, or both, are patterned to define more than one electrode region more electrode regions each having a lateral dimension of less than about 5000 micrometers and thereby define light emitting regions within the layer when energized.

23. The system of claim 22, comprising a backlight device joined to the two or more light emitting devices to form a layered device, wherein the backlight device is configured to be individually illuminated by the electrical control and power unit, and wherein the backlight device comprises a layer comprising an electroluminescent organic material, wherein the backlight device is configured to emit light uniformly across the layered device.

* * * * *